United States Patent
Ide et al.

(10) Patent No.: US 7,961,446 B2
(45) Date of Patent: Jun. 14, 2011

(54) TEMPERATURE PROTECTION CIRCUIT, POWER SUPPLY, AND ELECTRONIC DEVICE

(75) Inventors: Yazu Ide, Kyoto (JP); Yuichi Aoki, Kyoto (JP); Masaaki Fuji, Kyoto (JP); Hirokazu Oki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 581 days.

(21) Appl. No.: 12/066,855

(22) PCT Filed: Sep. 15, 2006

(86) PCT No.: PCT/JP2006/318405
§ 371 (c)(1),
(2), (4) Date: Mar. 14, 2008

(87) PCT Pub. No.: WO2007/032489
PCT Pub. Date: Mar. 22, 2007

(65) Prior Publication Data
US 2009/0262468 A1    Oct. 22, 2009

(30) Foreign Application Priority Data

Sep. 16, 2005 (JP) ................................. 2005-269499

(51) Int. Cl.
*H02H 5/04* (2006.01)
(52) U.S. Cl. .......................................... 361/103; 361/18
(58) Field of Classification Search .................... None
See application file for complete search history.

(56) References Cited

U.S. PATENT DOCUMENTS

| | | | |
|---|---|---|---|
| 587,026 A | 7/1897 | Voelker et al. | |
| 5,870,267 A | 2/1999 | Kitano | |
| 5,943,206 A * | 8/1999 | Crayford | 361/103 |
| 6,031,703 A * | 2/2000 | Serpinet et al. | 361/103 |
| 6,222,761 B1 * | 4/2001 | Gerber et al. | 365/185.02 |
| 6,351,360 B1 * | 2/2002 | Kotowski et al. | 361/103 |
| 7,173,802 B2 | 2/2007 | Hisada et al. | |

FOREIGN PATENT DOCUMENTS

| | | |
|---|---|---|
| CN | 1178406 A | 4/1998 |
| EP | 821459 | 1/1998 |
| JP | 64-12481 | 1/1989 |
| JP | 06-16540 | 3/1994 |
| JP | 06-061414 | 3/1994 |
| JP | 10-093010 | 4/1998 |
| JP | 10-117428 | 5/1998 |
| JP | 2004-140094 | 5/2004 |
| JP | 2004-253936 | 9/2004 |

* cited by examiner

*Primary Examiner* — Stephen W Jackson
*Assistant Examiner* — Terrence R Willoughby
(74) *Attorney, Agent, or Firm* — Fish & Richardson P.C.

(57) ABSTRACT

A temperature protection circuit comprises means adapted to compare the temperature being monitored with each of threshold temperatures and judging that the temperature being monitored reaches a threshold temperature when the temperature being monitored is maintained at the threshold temperature or more for a predetermined confirmation period, means adapted to set a longer confirmation period as the threshold temperature compared with the temperature being monitored is lower, means adapted to generate one of corresponding temperature protection signals (Sarm, Slmt, Stsd1, Stsd2) according to the judgment of which threshold temperature the temperature being monitored reaches. With this constitution, temperature protection operation can be preformed with high accuracy and high safety without unnecessarily narrowing the range of the operating temperature of an IC to be protected.

10 Claims, 3 Drawing Sheets

TEMPERATURE PROTECTION CIRCUIT, POWER SUPPLY, AND ELECTRONIC DEVICE

TECHNICAL FIELD

The present invention relates to a temperature protection circuit, and a power supply and an electronic device provided with a temperature protection circuit, and in particular, relates to improvement of accuracy and security of a temperature protecting function thereof.

BACKGROUND ART

Conventionally, many semiconductor integrated circuit devices (hereinafter "ICs (integrated circuits)") such as power supplies or motor drive units that drive a power transistor are provided with a temperature protection circuit (a so-called thermal shutdown circuit) as means adapted to prevent breakage of the IC (especially breakage of the power transistor that generates heat) due to abnormal generation of heat (see, for example, Patent Publications 1 and 2 filed by the applicant of the present application).

As other conventional arts related to the present invention, there have been disclosed and proposed: a temperature protection device in which a plurality of power elements are each individually checked for abnormal generation of heat, and a power element that is found to be abnormally generating heat is made to stop its operation and threshold temperatures of the other power elements, which may be effected by the abnormal generation of heat, are temporarily raised, thereby preventing normally operating power elements from being stopped (see Patent Publication 3); and an abnormal temperature detecting circuit that is capable of outputting an abnormal-temperature signal having high detection accuracy by increasing the output difference between a temperature detecting circuit and a temperature setting circuit at temperatures other than a set temperature by use of temperature-dependent difference in output variation coefficient between the temperature detection circuit and the temperature setting circuit (see Patent Publication 4).

DISCLOSURE OF THE INVENTION

Problems to be Solved by the Invention

It is true that the above-mentioned conventional IC provided with a temperature protection circuit can prevent breakage of the IC by detecting abnormal heat generation in the IC resulting from malfunction or overload and then cutting off heat generation.

However, in an IC provided with the conventional temperature protection circuit described above, the operation of the IC is immediately shut down when a temperature monitored by the temperature protection circuit reaches a threshold temperature. Hence, if this temperature protection circuit is applied in a power IC or a motor drive IC, in which a monitored temperature varies very frequently with the original operation of an IC (i.e., pulse driving of a load), unintended shutdown operation may be performed by the temperature protection circuit, leading to a problem that the operation temperature range of the IC becomes unnecessarily narrow.

Furthermore, in the IC provided with the conventional temperature protection circuit, a chip temperature cannot be found before the output of the IC is abruptly turned off by shutdown operation performed in the case where abnormal heat generation is taking place. This makes thermal design of the IC difficult, and in some devices in which this IC is incorporated, the shut down of the whole system cannot be carried out securely when abnormal generation of heat is found to be taking place by the temperature protection circuit. For example, in an electronic device using a power supply IC provided with the above described conventional temperature protection circuit as a power supply for a microcomputer, when the operation of the power supply IC is shut down by the temperature protection circuit, power supply to the microcomputer is cut off before the microcomputer completes its own formatting and saving memory data, and as a result, the whole system cannot be normally shut down.

Moreover, in the IC provided with the conventional temperature protection circuit, noise and surge are liable to be generated; in particular, in the case where the IC drives an L load having an inductive component, a counter electromotive voltage generated in the L load may shoot up above a withstand voltage of the IC when the IC is shut down, and this leads to breakage of the IC.

In view of the above described problems, an object of the present invention is to provide a temperature protection circuit capable of performing temperature protection operation with a higher degree of accuracy and security, and a power supply and an electronic device incorporating the same.

Means for Solving the Problem

To achieve the above object, according to one aspect of the present invention, a temperature protection circuit includes: means adapted to compare a monitored temperature with each of a plurality of threshold temperatures and find the monitored temperature to have reached a threshold temperature when the monitored temperature has been maintained at the threshold temperature or higher over a predetermined confirmation period; means adapted to set the confirmation period longer according as a threshold temperature compared with the monitored temperature is lower; and means adapted to generate a temperature protection signal corresponding to a threshold temperature that the monitored temperature is found to have reached (first configuration).

The first configuration described above is not limited only to a case where three or more threshold temperatures are set (as in an embodiment which will be described later), but includes in its concept a case where two threshold temperatures are set. In the case where two threshold temperatures are set, the confirmation period for the lower threshold temperature is set longer than that for the higher threshold temperature.

With this configuration, even in the case where a monitored temperature varies very frequently with the original operation of the IC (i.e., pulse driving of a load) as in the case where the temperature protection circuit is applied in a power supply IC or a motor drive IC, since the confirmation period is set longer for a threshold temperature on the low temperature side, which does not need to be dealt with so urgently, unintended shutdown operation is less likely to be performed by the temperature protection circuit. On the other hand, in the case where abnormal heating is undoubtedly taking place, since the monitored temperature is assumed to reach a higher threshold temperature, the confirmation period is set shorter than the one described above, and thus shutdown operation is performed without delay. Thus, a more accurate and more secure temperature protection operation can be performed without unnecessarily narrowing the operation temperature range of a protected IC.

It is preferable that the temperature protection circuit having the first configuration described above include: heating detecting means adapted to generate a heating detecting voltage a level of which varies according to the monitored temperature; alarm signal generating means adapted to generate an alarm signal for informing that the monitored temperature has reached a first threshold temperature on finding the monitored temperature to have reached the first threshold temperature based on the heating detecting voltage; suppressing signal generating means adapted to generate a suppressing signal for suppressing operation of a protected circuit continuously or in stages according to the monitored temperature after the monitored temperature is found based on the alarm signal to have reached the first threshold temperature; first cut-off signal generating means adapted to generate a first cut-off signal for shutting down operation of the protected circuit when the monitored temperature is found based on the heating detecting voltage to have reached a second threshold temperature that is higher than the first threshold temperature; and second cut-off signal generating means for generating a second cut-off signal for shutting down operation of all circuits including the protected circuit but excluding the temperature protection circuit (and circuits necessary for its operation) when the monitored temperature is found based on the heating detecting voltage to have reached a third threshold temperature that is higher than the second threshold temperature (second configuration). With this configuration, a chip temperature can be found before shutdown by monitoring the alarm signal and the suppressing signal, and this facilitates thermal design of an IC. Furthermore, with this configuration, the operation of the protected circuit is gradually suppressed, until shutdown operation finally starts to be performed, and this makes it possible to prevent the generation of noise and surge that may cause breakage of the IC.

In the temperature protection circuit having the second configuration described above, it is preferable that the alarm signal generating means find the monitored temperature to have reached the first threshold temperature when the monitored temperature has been maintained at the first threshold temperature or higher over a first confirmation period, that the first cut-off signal generating means find the monitored temperature to have reached the second threshold temperature when the monitored temperature has been maintained at the second threshold temperature or higher over a second confirmation period that is shorter than the first confirmation period, and that the second cut-off signal generating means immediately find the monitored temperature to have reached the third threshold temperature when the monitored temperature reaches the third threshold temperature (third configuration).

In the temperature protection circuit having the third configuration described above, it is preferable that the alarm signal generating means include: a first comparing section that compares a heating detecting voltage corresponding to the monitored temperature with a first threshold voltage corresponding to the first threshold temperature and an output logic of which is enabled when the monitored temperature is higher than the first threshold temperature; and a first enable-state limiting section an output logic of which is enabled only when an output logic of the first comparing section has been kept enabled over a first confirmation period, the alarm signal generating means outputting an output signal of the first enable-state limiting section as the alarm signal, that the first cut-off signal generating means include: a second comparing section that compares a heating detecting voltage corresponding to the monitored temperature with a second threshold voltage corresponding to the second threshold temperature and an output logic of which is enabled when the monitored temperature is higher than the second threshold temperature; and a second enable-state limiting section an output logic of which is enabled only when an output logic of the second comparing section has been kept enabled over a second confirmation period, the first cut-off signal generating means outputting an output signal of the second enable-state limiting section as the first cut-off signal, and that the second cut-off signal generating means include: a third comparing section that compares a heating detecting voltage corresponding to the monitored temperature with a third threshold voltage corresponding to the third threshold temperature and an output logic of which is enabled when the monitored temperature is higher than the third threshold temperature; and a latch section that latches an enable state of the output logic of the third comparing section, the second cut-off signal generating means outputting an output signal of the latch section as the cut-off signal (fourth configuration).

In the temperature protection circuit having any one of the second to fourth configurations described above, it is preferable that permission of operation of the suppressing signal generating means and the first cut-off signal generating means is determined according to an output logic of the alarm signal, and permission of operation of the second cut-off signal generating means is determined according to an output logic of the first cut-off signal (fifth configuration). With this configuration, it is possible to suppress unnecessary circuit operation to reduce power consumption.

According to another aspect of the present invention, a power supply includes: the temperature protection circuit having any one of the second to fifth configurations; and a power supply circuit that is means adapted to generate a predetermined output voltage from an input voltage, an output current of which is suppressed according to the suppressing signal, and operation of which is cut off according to the cut-off signal (sixth configuration). With this configuration, it is possible to provide a power supply that is capable of performing temperature protection operation with a higher degree of accuracy and security without unnecessarily narrowing its operation temperature range.

According to still another aspect of the present invention, an electronic device includes the power supply having the sixth configuration described above; and a system circuit using an output voltage of the power supply as its power. Here, the system circuit shuts down its own operation in response to the alarm signal before power supplied from the power supply is cut off (seventh configuration). With this configuration, an electronic device can be provided that is capable of performing more secure temperature protection operation as a whole system.

ADVANTAGES OF THE INVENTION

As described above, according to the present invention, more accurate and more secure temperature protection operation can be performed without unnecessarily narrowing the operation temperature range of a protected IC, and this makes it possible to perform more secure temperature protection operation as a whole system.

Figure 1:
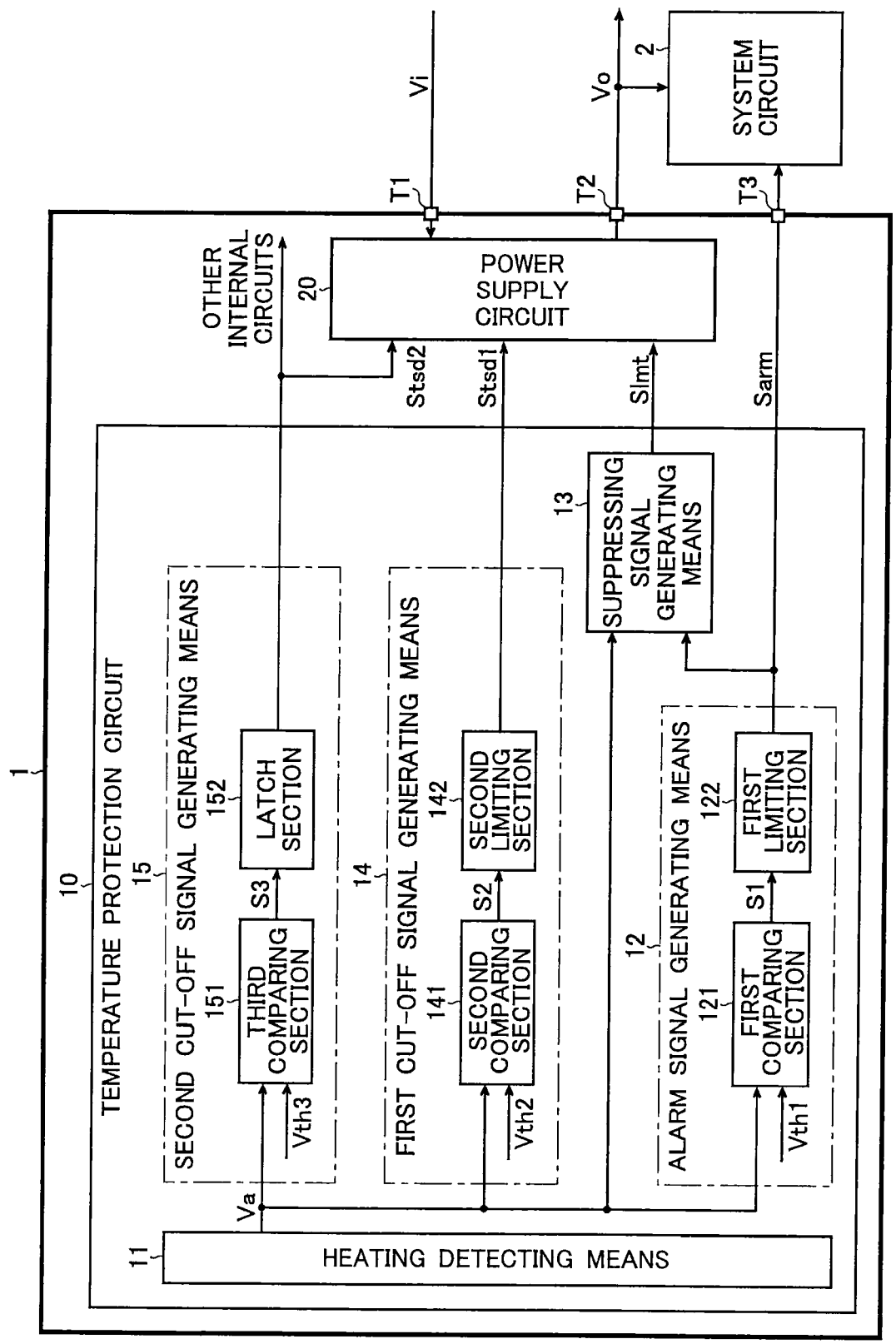
[FIG. 1] is a block diagram schematically showing an electronic device embodying the present invention.

LIST OF REFERENCE SYMBOLS 1 power supply IC
2 system circuit (e.g., microcomputer)
10 temperature protection circuit
11 heating detecting means
12 alarm signal generating means
121 first comparing section (for detecting 150° C.)
122 first enable-state limiting section
13 suppressing signal generating means
14 first cut-off signal generating means
141 second comparing section (for detecting 175° C.)
142 second enable-state limiting section
15 second cut-off signal generating means
151 third comparing section (for detecting 200° C.)
152 latch section
20 power supply circuit
T1 to T3 external terminals

BEST MODE FOR CARRYING OUT THE INVENTION

A detailed description will be given below dealing with, as an incorporating device in which a temperature protection circuit of the present invention is incorporated, a power supply IC that supplies power to a system circuit (e.g., a microcomputer) of an electronic device.

FIG. 1 is a block diagram schematically showing the configuration of an electronic device of the present invention.

As shown in this figure, the electronic device of the present invention includes a power supply IC 1 for generating an output voltage Vo from an input voltage Vi and a system circuit 2 that uses the output voltage Vo from the power supply IC 1 as its power. The power supply IC 1 is a semiconductor integrated circuit device provided with, in a form integrated into an integrated circuit, a temperature protection circuit lo and a power supply circuit 20.

The temperature protection circuit 10 uses as its drive voltage the input voltage Vi supplied thereto via an external terminal T1, and generates various temperature protection signals (i.e., an alarm signal Sarm, a suppressing signal Slmt, a first cut-off signal Stsd1, and a second cut-off signal Stsd2) by exploiting a characteristic that a base-emitter forward voltage drop of a bipolar transistor and a forward voltage drop of a diode vary depending on ambient temperature.

When a monitored temperature Tj (the temperature of heat generated by a power transistor provided in the power supply circuit 20) is found to have reached a first threshold temperature Tth1 (e.g., 150° C.), the alarm signal Sarm informs the system circuit 2 to that effect. More specifically, the alarm signal Sarm is a binary signal that is enabled (e.g., takes a high level) when the monitored temperature Tj is found to have reached the first threshold temperature Tth1, and that is disabled (e.g., takes a low level) when the monitored temperature Tj is found not to have reached the first threshold temperature Tth1.

Figure 2:
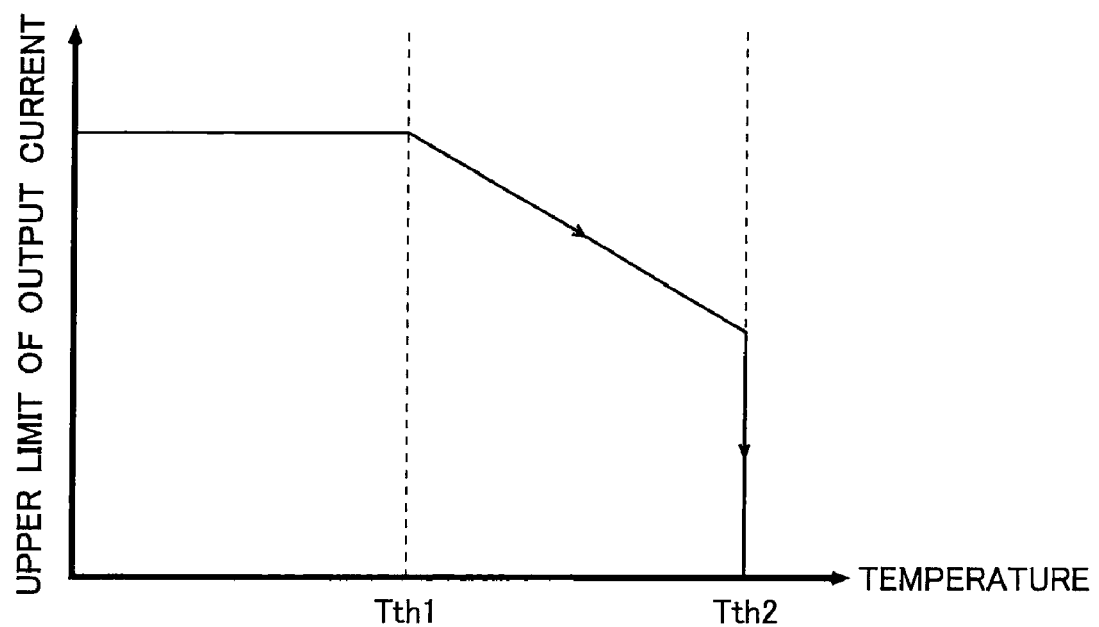
[FIG. 2] is a diagram showing an example of temperature protection operation.

The suppressing signal Slmt is a signal for suppressing the operation of the power supply circuit 20 (the upper limit of its output current) continuously or in stages according to the monitored temperature Tj after the monitored temperature Tj is found to have reached the first threshold temperature Tth1 (see FIG. 2).

The first cut-off signal Stsd1 is a signal for shutting down the operation of the power supply circuit 20 when the monitored temperature Tj is found to have reached a second threshold temperature Tth2 (e.g., 175° C.) that is higher than the first threshold temperature Tth1 (see FIG. 2). More specifically, the first cut-off signal Stsd1 is a binary signal that is enabled (e.g., takes a high level) when the monitored temperature Tj is found to have reached the second threshold temperature Tth2, and that is disabled (e.g., takes a low level) when the monitored temperature Tj is found not to have reached the second threshold temperature Tth2.

The second cut-off signal Stsd2 is a signal for shutting down the operation of all internal circuits (not shown) including the power supply circuit 20 but excluding the temperature protection circuit 10 (and circuits necessary for the operation of the temperature protection circuit 10) when the monitored temperature Tj is found to have reached a third threshold temperature Tth3 (e.g., 200° C.) that is higher than the second threshold temperature Tth2. More specifically, the second cut-off signal Stsd2 is a binary signal that is enabled (e.g., takes a high level) when the monitored temperature Tj is found to have reached the third threshold temperature Tth3, and is disabled (e.g., takes a low level) when the monitored temperature Tj is found not to have reached the third threshold temperature Tth3.

The provision of this temperature protection circuit 10 makes it possible to perform different temperature protection operations according to which threshold temperature the monitored temperature Tj is found to have reached, and thereby to prevent breakage of the power supply IC 1 (in particular, breakage of a power transistor provided in the power supply circuit 20). Furthermore, since the chip temperature of the power supply IC 1 is found before a shutdown by monitoring the alarm signal Sarm and the suppressing signal Slmt, the thermal design of the power supply IC 1 can be facilitated.

A detailed description will later be given of the inner configuration and operation of the temperature protection circuit 10.

The power supply circuit 20 is direct current converting means adapted to convert the input voltage V1 supplied via the external terminal T1 into a desired output voltage Vo to supply the output voltage Vo to the system circuit 2 and an external load (not shown) via an external terminal T2.

The power supply circuit 20 has a function to suppress its own operation (i.e., the upper limit of its output current) continuously or in stages in response to receiving the suppressing signal Slmt from the temperature protection circuit 10 (see FIG. 2). With this configuration, as a preliminary temperature protection operation, abnormal heating of the power supply IC 1 can be suppressed before the monitored temperature Tj rises so high that the operation of the power supply IC 1 must be shut down. This makes more secure temperature protection operation possible, and furthermore, since the output of the power supply IC 1 is not abruptly cut off even by the later-described shutdown operation performed when abnormal heating takes place, various problems (e.g., generation of noise and surge) can be avoided, and thus the operation of the power supply IC 1 can be securely stopped.

The power supply circuit 20 has a function to recognize, in response to receiving the first cut-off signal Stsd1 from the temperature protection circuit 10, whether or not abnormal heating is taking place according to whether the first cut-off signal Stsd1 is enabled or disabled and to control permission and inhibition of power output operation (see FIG. 2). With this configuration, breakage of an IC due to abnormal heating can be prevented by shutting down the operation of the power supply circuit 20 when abnormal increase in temperature cannot be stopped even by output current suppressing control by use of the suppressing signal Slmt.

All the internal circuits (not shown) including the power supply circuit 20 but excluding the temperature protection circuit 10 (and circuits necessary for its operation) have a function to recognize, in response to receiving the second cut-off signal Stsd2 from the temperature protection circuit 10, whether abnormal heating is still taking place even after the operation of the power circuit 20 is shut down according to whether the second cut-off signal Stsd2 is enabled or disabled and to control permission and inhibition of the operation of the power supply circuit 20. With this configuration, when abnormal increase in temperature cannot be stopped even by cutting off the power supply by use of the first cut-off signal Stsd1, breakage and thermal runaway of an IC due to abnormal heating, and furthermore, smoldering and ignition of an IC can be prevented by completely shutting down all the operation of the power supply IC 1 except for the temperature protection operation.

The system circuit 2 has a function to cut off its own operation according to the enable state of the alarm signal Sarm before the power supply from the power supply IC 1 is cut off. More specifically, as the system circuit 2, a microcomputer may be used, and the system circuit 2 has a function to start its formatting and saving memory data according to the enable state of the alarm signal Sarm. With this configuration, since the whole system can be normally shut down before the power supply is cut off by the temperature protection circuit 10 when abnormal heating is found to be taking place, an electronic device as a whole system can perform more secure temperature protection operation.

The temperature protection circuit 10 described above is provided in the vicinity of the power supply circuit 20 overheating of which (in particular, overheating of a power transistor provided therein) is monitored. With this configuration, a junction temperature (the monitored temperature Tj) of the power transistor that generates heat can be directly detected, and thereby highly accurate temperature protection operation can be performed.

The alarm signal Sarm, the suppressing signal Slmt, and the first cut-off signal Stsd1 are of an automatic recovery type having hysteresis between the first and second threshold temperatures Tth1 and Tth2. This permits the power supply IC 1 to automatically recover its operation without waiting for an external recovery signal when the monitored temperature Tj drops. On the other hand, the second cut-off signal Stsd2 is of a latch type, and is not reset to be disabled unless a predetermined reset signal (e.g., a power-on-reset signal) is fed. Thus, when the monitored temperature Tj rises up to the threshold temperature Tth3 at which thermal runaway, smoldering, and ignition of the power supply IC 1 may occur, in which case the probability of some malfunction occurring in the power supply IC 1 and its peripheral circuits is high, the operation of the power supply IC 1 can be shut down securely until the cause is removed and a predetermined reset signal is fed. The adoption of the two types of signals also makes it possible to suppress logic oscillation of the temperature protection signals.

Figure 3:
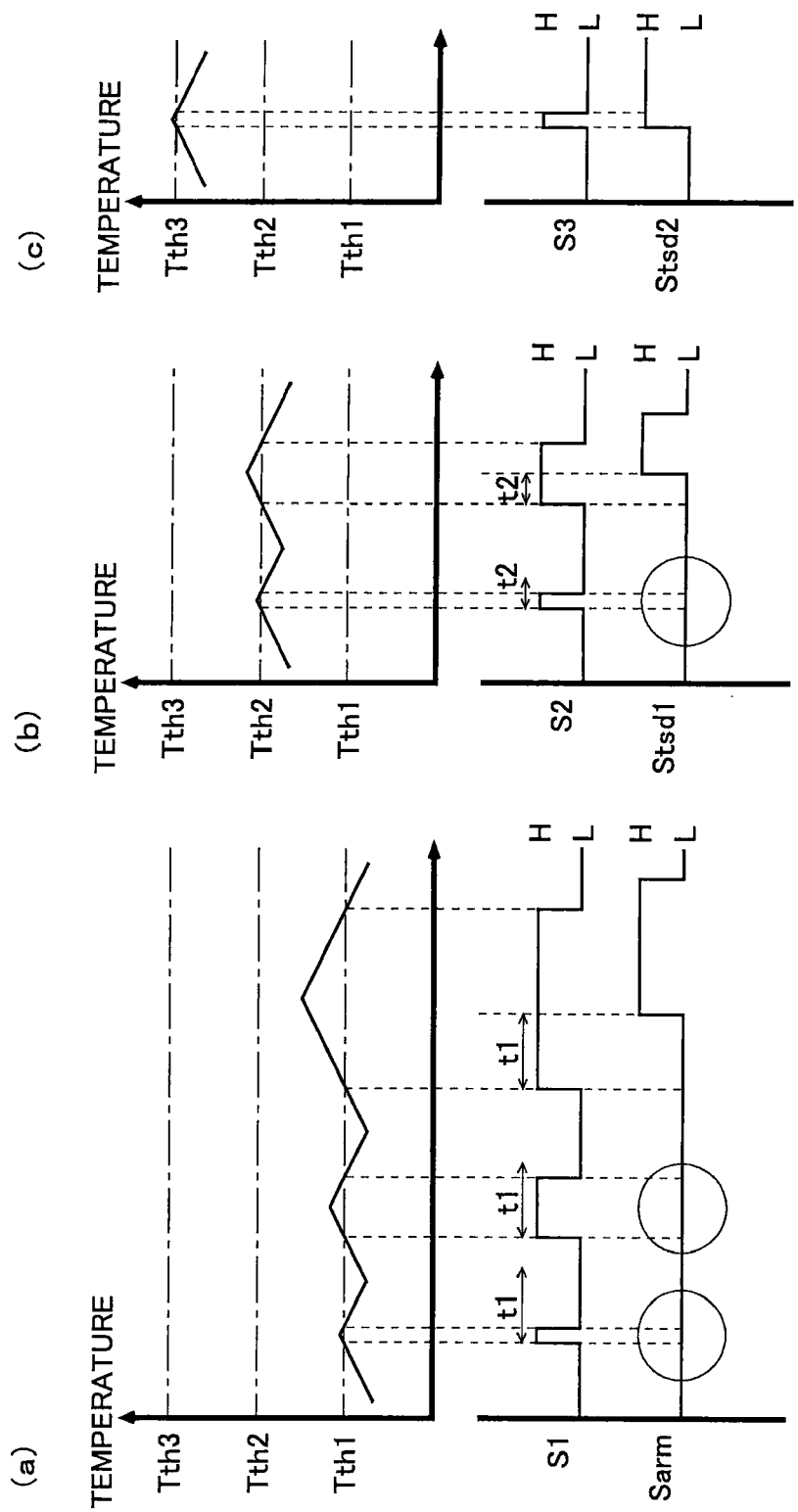
[FIG. 3] is a diagram illustrating an example of enable-state limiting operation.

A more specific and detailed description will be given below of the circuit configuration and operation of the temperature protection circuit 10, with reference to FIG. 3 as well as to FIGS. 1 and 2 which have already been referred to. FIG. 3 is a diagram illustrating an example of enable-state limiting operation.

As shown in FIG. 1, the temperature protection circuit 10 of this embodiment includes heating detecting means 11, alarm signal generating means 12, suppressing signal generating means 13, first cut-off signal generating means 14, and second cut-off signal generating means 15.

The heating detecting means 11 is means adapted to generate a heating detecting voltage Va (a voltage signal whose voltage level decreases with an increase in the monitored temperature Tj) by exploiting a characteristic that a base-emitter forward voltage drop of a bipolar transistor and a forward voltage drop of a diode vary depending on ambient temperature (a negative temperature characteristic of approximately −2 mV/0° C.).

The alarm signal generating means 12 includes a first comparing section 121 and a first enable-state limiting section 122, and is means adapted to generate the alarm signal Sarm when the monitored temperature Tj is found based on the heating detecting voltage Va to have reached the first threshold temperature Tth1.

The first comparing section 121 compares the heating detecting voltage Va corresponding to the monitored temperature Tj with a first threshold voltage Vth1 corresponding to the first threshold temperature Tth1 so as to generate a comparison signal S1 whose output logic is changed according to which of the two voltages is higher. The comparison signal S1 is disabled (takes a low level) when the heating detecting voltage Va is higher than the first threshold voltage Vth1, and in contrast, when the former is lower than the latter, the comparison signal S1 is enabled (takes a high level). That is, the comparison signal S1 is a signal that is enabled when the monitored temperature Tj reaches the first threshold temperature Tth1.

The first enable-state limiting section 122 enables the logic of the alarm signal Sarm only when the logic of the comparison signal S1 is kept enabled over a first confirmation period t1. Conversely, even if the comparison signal S1 is temporarily enabled, unless it is kept enabled over the first confirmation period t1, the alarm signal Sarm is left disabled (see FIG. 3(a)).

That is, at the alarm signal generating means 12, the monitored temperature Tj is found to have reached the first threshold temperature Tth1 when the monitored temperature Tj has been maintained at the first threshold temperature Tth1 or higher over the first confirmation period t1.

The suppressing signal generating means 13 is means adapted to generate the suppressing signal Slmt for suppressing the operation of the power supply circuit 20 (the upper limit of its output current) continuously or in stages according to the monitored temperature Tj after the monitored temperature Tj is found based on the alarm signal Sarm to have reached the first threshold temperature Tth1. It is preferable that, as the suppressing signal generating means 13, an amplifier be used that amplifies the difference voltage between the heating detecting voltage Va and the first threshold voltage Vth1 and outputs the resulting voltage. Controlling the output current from the power supply circuit 20 by use of the suppressing signal Slmt generated by the suppressing signal generating section 13 described above makes it possible to easily achieve the preliminary temperature protection operation shown in FIG. 2 which has already been referred to.

The suppressing signal generating means 13 is configured such that permission of its operation is determined according to the output logic of the alarm signal Sarm; more specifically, the suppressing signal generating means 13 is configured such that its operation is stopped until the above mentioned alarm signal Sarm is enabled. With this configuration, unwanted circuit operation can be reduced, and thereby the power consumption can be reduced.

The first cut-off signal generating means 14 includes a second comparing section 141 and a second enable-state limiting section 142, and is means adapted to generate the first cut-off signal Stsd1 when the monitored temperature Tj is found based on the heating detecting voltage Va to have reached the second threshold temperature Tth2 that is higher than the first threshold temperature Tth1.

The second comparing section 141 compares the heating detecting voltage Va corresponding to the monitored temperature Tj with the second threshold voltage Vth2 corresponding to the second threshold temperature Tth2, and generates a comparison signal S2 whose output logic is changed according to which of the two voltages is higher. The comparison signal S2 is disabled (takes a low level) when the heating detecting voltage Va is higher than the second threshold voltage Vth2, and in contrast, when the former is lower than the latter, the comparison signal S2 is enabled (takes a high level). That is, the comparison signal S2 is a signal that is enabled when the monitored temperature Tj reaches the second threshold temperature Tth2.

The second enable-state limiting section 142 enables the logic of the first cut-off signal Stsd1 only when the logic of the comparison signal S2 is kept enabled over a second confirmation period t2 that is shorter than the first confirmation period t1. Conversely, even if the comparison signal S2 is temporarily enabled, unless it is kept enabled over the second confirmation period t2, the first cut-off signal is left disabled (see FIG. 3(b)).

That is, at the first cut-off signal generating means 14, the monitored temperature Tj is found to have reached the second threshold temperature Tth2 when the monitored temperature Tj has been maintained at the second threshold temperature Tth2 or higher over the second confirmation period t2 that is shorter than the first confirmation period t1.

As is the case with the suppressing signal generating means 13, the first cut-off signal generating means 14 is configured such that permission of its operation is determined according to the output logic of the alarm signal Sarm. With this configuration, unwanted circuit operation can be reduced, and thereby the power consumption can be reduced.

The second cut-off signal generating means 15 includes a third comparing section 151 and a latch section 152, and is means adapted to generate the second cut-off signal Stsd2 when the monitored temperature Tj is found based on the heating detecting voltage Va to have reached the third threshold temperature Tth3 that is higher than the second threshold temperature Tth2.

The third comparing section 151 compares the heating detecting voltage Va corresponding to the monitored temperature Tj and the third threshold voltage Vth3 corresponding to the third threshold temperature Tth3, and generates a comparison signal S3 whose output logic is changed according to which of the two voltages is higher. The comparison signal S3 is disabled (takes a low level) when the heating detecting voltage Va is higher than the third threshold voltage Vth3, and in contrast, when the former is lower than the latter, the comparison signal S3 is enabled (takes a high level). That is, the comparison signal S3 is a signal that is enabled when the monitored temperature Tj reaches the third threshold temperature Tth3.

The latch section 152 latches an enable state of the comparison signal S3, and thereafter, outputs a signal having a logic corresponding thereto as the second cut-off signal Stsd2 (see FIG. 3(c)).

The second cut-off signal generating means 15 is not provided with an enable-state limiting section, and the comparison signal S3 is directly fed to the latch section 152. That is, at the second cut-off signal generating means 15, the monitored temperature Tj is immediately found to have reached the third threshold temperature Tth3 when the monitored temperature Tj reaches the third threshold temperature Tth3.

The second cut-off signal generating means 15 is configured such that permission of its operation is determined according to the output logic of the first cut-off signal Stsd1; more specifically, its operation is stopped until the above mentioned first cut-off signal Stsd1 is enabled. With this configuration, unwanted circuit operation can be reduced, and thereby the power consumption can be reduced.

As described above, the temperature protection circuit 10 of this embodiment includes: means adapted to compare the monitored temperature Tj with each of the plurality of threshold temperatures Tth1 to Tth3 and find the monitored temperature Tj to have reached a threshold temperature when the monitored temperature Tj has been maintained at the threshold temperature or higher over a predetermined confirmation period; means adapted to set the confirmation period longer according as the threshold temperature that is compared with the monitored temperature is lower; and means adapted to generate a temperature protection signal (the alarm signal Sarm, the suppressing signal Slmt, the first cut-off signal Stsd1, or the second cut-off signal Stsd2) that corresponds to a threshold temperature the monitored temperature Tj is found to have reached.

With this configuration, even in the case where the monitored temperature Tj varies very frequently with the original operation of the power supply IC 1 (i.e., pulse driving of the power transistor provided in the power circuit 20), since the confirmation period mentioned above is set long for a threshold temperature on the low-temperature side, which does not need to be dealt with so urgently, unintended shutdown operation is less likely to be performed by the temperature protection circuit 10. In the case where abnormal heating is undoubtedly taking place, since the monitored temperature Tj is assumed to reach a higher threshold temperature, the above mentioned confirmation period is set shorter, and thus shutdown operation is performed without delay. Therefore, a more accurate and more secure temperature protection operation can be performed without unnecessarily narrowing the operation temperature range of the power supply IC 1.

In the description given above of this embodiment, a power supply IC that supplies power to a system circuit (e.g., a microcomputer) of an electronic device is dealt with as an example of the incorporating device in which the temperature protection circuit of the present invention is incorporated; however, this is not meant to limit the incorporating device, and the temperature protection circuit of the present invention can be widely incorporated in other semiconductor integrated circuit devices such as motor drive ICs.

The present invention may be carried out in any manner other than specifically described above as an embodiment, and permits any variations and modifications within the spirit thereof.

For example, the embodiment described above deals with the case where a single heating detecting means 11 is shared by the temperature protection signal generating means 12 to 15; however this is not meant to limit the present invention in any way, and a plurality of heating detecting means may be provided such that each temperature protection signal generating means has one dedicated heating detecting means.

INDUSTRIAL APPLICABILITY

The present invention offers an art that is useful for optimizing the temperature protection operation performed in an electronic device that uses a power supply IC incorporating a temperature protection circuit as a power supply for a microcomputer.

What is claimed is:

1. A temperature protection circuit comprising:
    circuitry to compare a monitored temperature with each of a plurality of threshold temperatures to find the monitored temperature to have reached a threshold temperature when the monitored temperature has been maintained at the threshold temperature or higher over a predetermined confirmation period;
    circuitry to set the confirmation period such that the lower a threshold temperature is, compared with the monitored temperature, the longer the confirmation period is;
    circuitry to generate a temperature protection signal corresponding to a threshold temperature that the monitored temperature is found to have reached;
    heating detector to generate a heating detecting voltage a level of which varies according to the monitored temperature;
    alarm signal generator to generate an alarm signal for informing that the monitored temperature has reached a first threshold temperature on finding, based on the heating detecting voltage, the monitored temperature to have reached the first threshold temperature;
    suppressing signal generator to generate a suppressing signal for suppressing operation of a protected circuit continuously or in stages according to the monitored temperature after the monitored temperature is found based on the alarm signal to have reached the first threshold temperature;
    first cut-off signal generator to generate a first cut-off signal for shutting down operation of the protected circuit when the monitored temperature is found based on the heating detecting voltage to have reached a second threshold temperature that is higher than the first threshold temperature; and
    second cut-off signal generator for generating a second cut-off signal for shutting down operation of all circuits including the protected circuit but excluding the temperature protection circuit when the monitored temperature is found based on the heating detecting voltage to have reached a third threshold temperature that is higher than the second threshold temperature.

2. The temperature protection circuit of claim 1 wherein
    the alarm signal generator is arranged to find the monitored temperature to have reached the first threshold temperature when the monitored temperature has been maintained at the first threshold temperature or higher over a first confirmation period;
    the first cut-off signal generator is arranged to find the monitored temperature to have reached the second threshold temperature when the monitored temperature has been maintained at the second threshold temperature or higher over a second confirmation period that is shorter than the first confirmation period; and
    the second cut-off signal generator is arranged to find immediately the monitored temperature to have reached the third threshold temperature when the monitored temperature reaches the third threshold temperature.

3. The temperature protection circuit of claim 2 wherein
    the alarm signal generator includes: a first comparing section that compares a heating detecting voltage corresponding to the monitored temperature with a first threshold voltage corresponding to the first threshold temperature and an output logic of which is enabled when the monitored temperature is higher than the first threshold temperature; and a first enable-state limiting section an output logic of which is enabled only when an output logic of the first comparing section has been kept enabled over a first confirmation period, the alarm signal generator outputting an output signal of the first enable-state limiting section as the alarm signal,
    the first cut-off signal generator includes: a second comparing section that compares a heating detecting voltage corresponding to the monitored temperature with a second threshold voltage corresponding to the second threshold temperature and an output logic of which is enabled when the monitored temperature is higher than the second threshold temperature; and a second enable-state limiting section an output logic of which is enabled only when an output logic of the second comparing section has been kept enabled over a second confirmation period, the first cut-off signal generator outputting an output signal of the second enable-state limiting section as the first cut-off signal, and
    the second cut-off signal generator includes: a third comparing section that compares a heating detecting voltage corresponding to the monitored temperature with a third threshold voltage corresponding to the third threshold temperature and an output logic of which is enabled when the monitored temperature is higher than the third threshold temperature; and a latch section that latches an enable state of the output logic of the third comparing section, the second cut-off signal generator outputting an output signal of the latch section as the cut-off signal.

4. The temperature protection circuit of claim 1 wherein
    permission of operation of the suppressing signal generator and the first cut-off signal generator is determined according to an output logic of the alarm signal, and
    permission of operation of the second cut-off signal generator is determined according to an output logic of the first cut-off signal.

5. A power supply comprising:
    the temperature protection circuit of any one of claims 1 to 4; and
    a power supply circuit adapted to generate a predetermined output voltage from an input voltage, an output current of which is suppressed according to the suppressing signal, and operation of which is cut off according to the cut-off signal.

6. An electronic device comprising:
    the power supply of claim 5; and
    a system circuit arranged to use an output voltage of the power supply as its power and arranged to shut down its own operation in response to the alarm signal before power supplied from the power supply is cut off.

7. A temperature protection circuit comprising:
    circuitry to compare a monitored temperature with each of a plurality of threshold temperatures to find the monitored temperature to have reached a threshold temperature when the monitored temperature has been maintained at the threshold temperature or higher over a predetermined confirmation period;
    circuitry to set the confirmation period such that the lower a threshold temperature is, compared with the monitored temperature, the longer the confirmation period is;
    circuitry to generate a temperature protection signal corresponding to a threshold temperature that the monitored temperature is found to have reached;
    heating detector to generate a heating detecting voltage a level of which varies according to the monitored temperature;
    alarm signal generator to generate an alarm signal for informing that the monitored temperature has reached a first threshold temperature on finding, based on the heating detecting voltage, the monitored temperature to have reached the first threshold temperature;

suppressing signal generator to generate a suppressing signal for suppressing operation of a protected circuit continuously or in stages according to the monitored temperature after the monitored temperature is found based on the alarm signal to have reached the first threshold temperature; and cut-off signal generator to generate a cut-off signal for shutting down operation of the protected circuit when the monitored temperature is found based on the heating detecting voltage to have reached a second threshold temperature that is higher than the first threshold temperature.

8. The temperature protection circuit of claim 7 wherein the alarm signal generator is arranged to find the monitored temperature to have reached the first threshold temperature when the monitored temperature has been maintained at the first threshold temperature or higher over a first confirmation period; and the cut-off signal generator is arranged to find the monitored temperature to have reached the second threshold temperature when the monitored temperature has been maintained at the second threshold temperature or higher over a second confirmation period that is shorter than the first confirmation period.

9. The temperature protection circuit of claim 8 wherein the alarm signal generator includes: a first comparing section that compares a heating detecting voltage corresponding to the monitored temperature with a first threshold voltage corresponding to the first threshold temperature and an output logic of which is enabled when the monitored temperature is higher than the first threshold temperature, and a first enable-state limiting section an output logic of which is enabled only when an output logic of the first comparing section has been kept enabled over a first confirmation period, the alarm signal generator outputting an output signal of the first enable-state limiting section as the alarm signal; and the cut-off signal generator includes: a second comparing section that compares a heating detecting voltage corresponding to the monitored temperature with a second threshold voltage corresponding to the second threshold temperature and an output logic of which is enabled when the monitored temperature is higher than the second threshold temperature, and a second enable-state limiting section an output logic of which is enabled only when an output logic of the second comparing section has been kept enabled over a second confirmation period, the cut-off signal generator outputting an output signal of the second enable-state limiting section as the cut-off signal.

10. The temperature protection circuit any one of claims 7, 8 or 9 wherein permission of operation of the suppressing signal generator and the cut-off signal generator is determined according to an output logic of the alarm signal.

* * * * *